United States Patent
Nakamura et al.

(10) Patent No.: US 6,372,547 B2
(45) Date of Patent: *Apr. 16, 2002

(54) METHOD FOR MANUFACTURING ELECTRONIC DEVICE WITH RESIN LAYER BETWEEN CHIP CARRIER AND CIRCUIT WIRING BOARD

(75) Inventors: Yoshifumi Nakamura; Yoshihiro Bessho; Minehiro Itagaki, all of Osaka (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/038,069

(22) Filed: Mar. 11, 1998

Related U.S. Application Data

(62) Division of application No. 08/601,293, filed on Feb. 16, 1996, now Pat. No. 6,229,209.

(30) Foreign Application Priority Data

Feb. 23, 1995 (JP) ............................................. 7-035359

(51) Int. Cl.[7] ............................................. H01L 21/48
(52) U.S. Cl. ........................ 438/118; 438/126; 438/127
(58) Field of Search ................................ 438/126, 127, 438/613, 106, 108, 118, 124; 257/738, 737, 700, 778

(56) References Cited

U.S. PATENT DOCUMENTS 3,339,274 A * 9/1967 Saia et al. .................. 438/127
3,959,874 A   6/1976 Coucoulas
4,172,907 A * 10/1979 Mones et al. .............. 438/613
4,616,406 A * 10/1986 Brown ........................ 438/127
5,120,678 A   6/1992 Moore et al.

(List continued on next page.)

FOREIGN PATENT DOCUMENTS

| EP | 0 536 418 |   | 4/1993 |
| EP | 729182    | * | 8/1996 |
| JP | 55-29181  |   | 3/1980 |
| JP | 56-142656 |   | 11/1981 |
| JP | 62-136049 |   | 6/1987 |

(List continued on next page.)

OTHER PUBLICATIONS

Dec. 1996, Communication from European Patent Office and attached Search Report.

*Primary Examiner*—Olik Chaudhuri
*Assistant Examiner*—Alonzo Chambliss
(74) *Attorney, Agent, or Firm*—Merchant & Gould PC

(57) ABSTRACT

In BGA (Ball Grid Array), LGA (Land Grid Array) and the like, a resin layer is formed between an external connecting electrode of a chip carrier and a circuit wiring board. Consequently, the external connecting electrode can be prevented from cracking due to a difference between the coefficients of thermal expansion of the external connecting electrode and the circuit wiring board. Thus, the reliability in a thermal shock test can be enhanced. A connecting wiring which is conducted to an electrode of a semiconductor device is provided on a surface of an electrical insulating board, and the external connecting electrode for connection to a connecting electrode of the circuit wiring board is provided on a back face of the electrical insulating board. The external connecting electrode has a solder ball made of a conductor, and the resin layer formed on the side portion thereof.

8 Claims, 8 Drawing Sheets

U.S. PATENT DOCUMENTS

| | | | |
|---|---|---|---|
| 5,148,266 A | * 9/1992 | Khandros et al. | 257/773 |
| 5,155,904 A | * 10/1992 | Madj | 29/837 |
| 5,241,133 A | 8/1993 | Mullen, III et al. | |
| 5,316,788 A | 5/1994 | Dibble et al. | |
| 5,397,917 A | * 3/1995 | Ommen et al. | 257/698 |
| 5,433,822 A | * 7/1995 | Mimura et al. | 156/659.1 |
| 5,436,203 A | * 7/1995 | Lin | 438/126 |
| 5,468,681 A | * 11/1995 | Pasch | 257/737 |
| 5,581,122 A | 12/1996 | Chao et al. | 257/691 |
| 5,663,106 A | * 9/1997 | Karavakis et al. | 438/126 |
| 5,663,593 A | 9/1997 | Mostafazadeh et al. | |
| 5,798,563 A | * 8/1998 | Feilchenfeld et al. | 257/668 |
| 5,824,569 A | * 10/1998 | Brooks et al. | 438/127 |
| 5,889,655 A | * 3/1999 | Barrow | 361/760 |
| 6,034,437 A | * 3/2000 | Shibata | 257/783 |
| 6,229,209 B1 | * 5/2001 | Nakamura et al. | 257/737 |

FOREIGN PATENT DOCUMENTS

| | | | |
|---|---|---|---|
| JP | 2-234447 | | 9/1990 |
| JP | 3-107989 | | 5/1991 |
| JP | 6-252286 | | 9/1994 |
| JP | 7-22538 | | 1/1995 |
| JP | 8-88248 | * | 4/1996 |
| JP | 2000208547 | * | 7/2000 |

\* cited by examiner

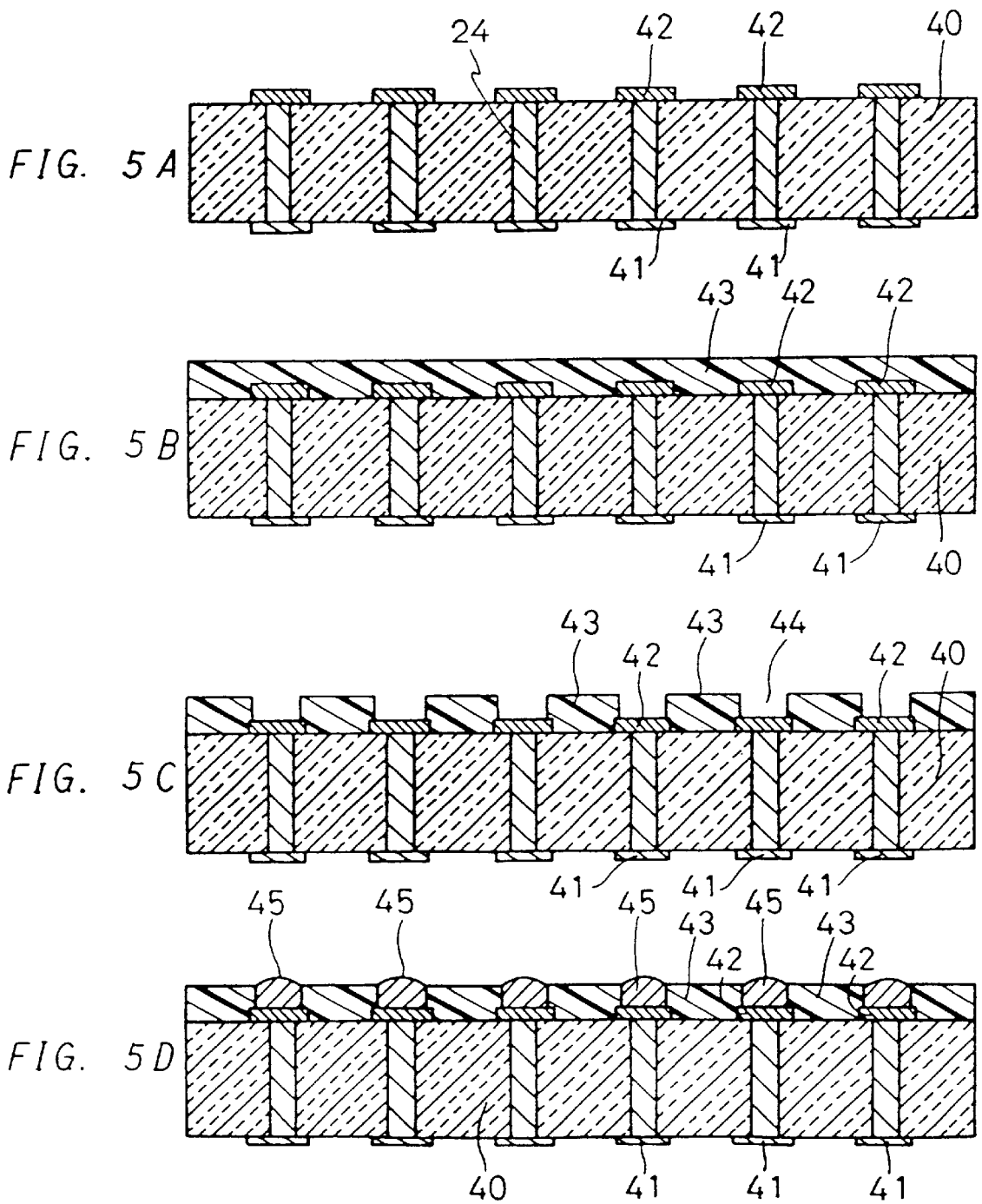

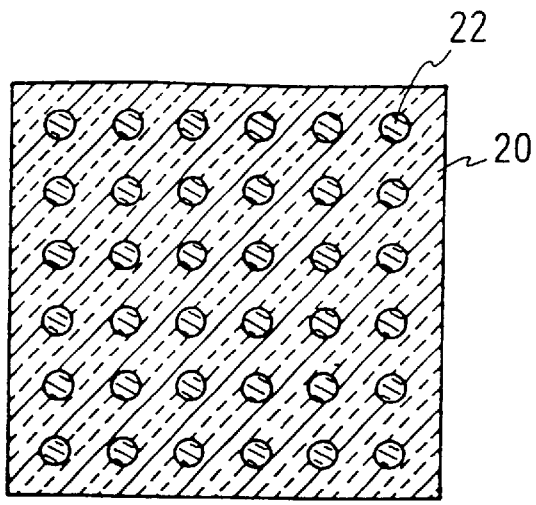
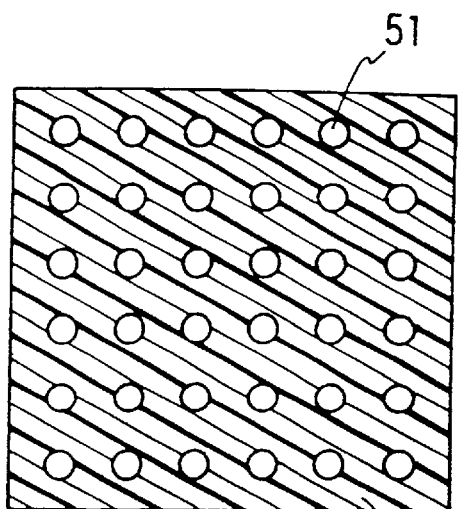
FIG. 6A FIG. 6B
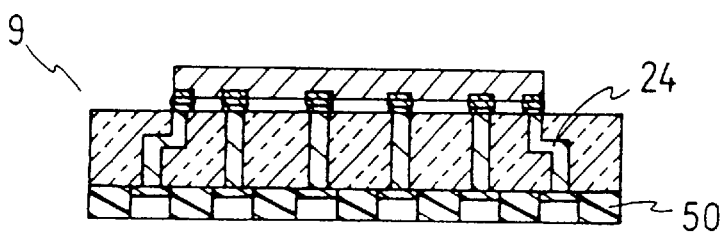
FIG. 6C
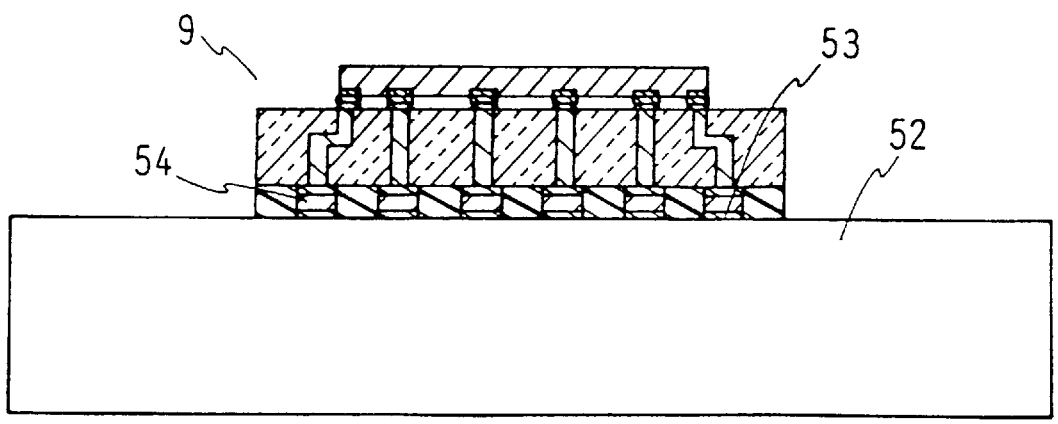
FIG. 6D

1

METHOD FOR MANUFACTURING ELECTRONIC DEVICE WITH RESIN LAYER BETWEEN CHIP CARRIER AND CIRCUIT WIRING BOARD

This application is a Divisional of application Ser. No. 08/601,293, filed Feb. 16, 1996 now U.S. Pat. No. 6,229,209, which application(s) are incorporated herein by reference.

FIELD OF THE INVENTION

The present invention relates to a chip carrier used for mounting a semiconductor device on a circuit wiring board and a method of manufacturing the same, and more particularly to a chip carrier for mounting the semiconductor device and for MCM (multichip module) and a method of manufacturing and mounting the same.

BACKGROUND OF THE INVENTION

Semiconductor devices of BGA (ball grid array) and LGA (land grid array) package types have conventionally been known. In the semiconductor devices of these types, external connecting electrodes of a chip carrier on which a semiconductor device is mounted are arranged like a grid on the back face thereof. These semiconductor devices have the external connecting electrodes provided on the back of a package so that the size can greatly be reduced as compared with a conventional semiconductor device of a QFP (Quadflat package) type. The pitch of the external connecting electrodes is 1.5 or 1.27 mm, while the semiconductor device of a QFP type has a pitch of 0.3 or 0.5 mm. Consequently, mounting can be performed easily. For this reason, the semiconductor devices of BGA and LGA package types have attracted favorable notice.

FIG. 8 shows a semiconductor device of a BGA package type according to the prior art. In FIG. 8, 1 designates a chip carrier, 2 designates a solder ball, 3 designates a semiconductor device, and 4 designates an external connecting electrode. The chip carrier 1 has a structure in which a connecting wiring 61 is provided on a surface 60a of an electrical insulating board 60 and the external connecting electrode 4 is provided on a back face 60b of the electrical insulating board 60. The connecting wiring 61 is conducted to an electrode pad 31 of the semiconductor device 3. The connecting wiring 61 of the surface 60a and an external drawing electrode 62 of the back face 60b are electrically conducted through a wiring 64 and the like provided in a through hole 63. The through hole 63 conducts both faces of the electrical insulating board 60.

As the external connecting electrodes of a BGA package type, the solder balls 2 are arranged like a grid on the back face of the chip carrier 1. The connection to a circuit wiring board (not shown) can be obtained by the solder balls 2. The semiconductor device of a LGA package type ham 2 structure in which the connection to the circuit wiring board can be obtained by a solder having no ball or a socket.

As compared with the semiconductor device of a LGA package type, the semiconductor device of a BGA package type uses the solder balls for mounting so that the mounting space between the chip carrier and the circuit wiring board is large. Consequently, the semiconductor device of a BGA package type has the higher mounting reliability upon solder mounting than that of a LGA package type. For this reason, the semiconductor device of a BGA package type which has the external connecting electrodes arranged like a grid has been commonly used. However, in a semiconductor device which should be developed, for example, a CPU of a computer, the combination of the LGA and the socket is often used.

However, in the case where the conventional chip carrier of a BGA or LGA package type is mounted on the circuit wiring board by a solder, the following troubles are caused. More specifically, the chip carrier is directly connected to the circuit wiring board by the solder. For this reason, when an environmental reliability test such as a thermal shock test, which changes a temperature from −40° C. to 100° C., is given as defined by JIS C0025, the external connecting electrode portions crack, the external connecting electrodes peel off and the connection becomes poor due to a difference between the coefficients of thermal expansion of the chip carrier and the circuit wiring board. Thus, BGA and LGA package types have poor reliability in the thermal shock test.

SUMMARY OF THE INVENTION

It is an object of the present invention to provide a chip carrier, and a method of manufacturing and mounting the same which can prevent external connecting electrode portions from cracking and prevent external connecting electrodes from peeling off so that reliability can be enhanced.

In order to achieve the above object, the present invention provides a chip carrier comprising an electrical insulating board, a connecting wiring for connection to the electrode of a semiconductor device which is provided on a first face of the electrical insulating board, and an external connecting electrode for connection to a connecting electrode of a circuit wiring board, provided on the back face of the electrical insulating board, wherein the external connecting electrode is formed by a bump made of a conductor, and a resin layer is formed so as to cover the side of the bump. The resin layer may be formed so as to cover a solder connecting portion after mounting.

It is preferred that the resin layer is formed flatly or like a convexity around the bump and the tip portion of the bump is exposed.

It is preferred that the resin layer is formed like a layer on the bark face of the electrical insulating board and the tip portion of the bump is exposed.

Preferably, the bump comprises a solder ball.

It is preferred that the bump is made of a conductor whose main component contains at least one of Sn, Cu, Ag, Au and Ni.

Preferably, the bump is covered with the resin layer to a level of 20% or more with respect to the height thereof from the chip carrier.

It is preferred that the resin is an epoxy resin.

Preferably, the thickness of the resin layer ranges from 50 µm to 1000 µm.

The present invention provides a method of manufacturing a chip carrier comprising the steps of providing a connecting wiring for connection to the electrode of a semiconductor device on a first face of an electrical insulating board, forming an external connecting electrode having a bump for connection to the connecting electrode of a circuit wiring board on a back face of the electrical insulating board, covering the side portion of the external connecting electrode with a resin paste, and heat-treating at a temperature at which the rosin paste is hardened so that a resin layer is formed.

It is preferred that the resin paste is poured between the external connecting electrodes, and heat-treatment is performed at a temperature at which the resin paste is hardened so that the resin layer is formed.

Preferably, heat is supplied and the resin is poured into the back face on which the external connecting electrodes are provided so as to form the resin layer.

It is preferred that the back face on which the external connecting electrode made of the bump is formed is immersed in the resin paste, the chip carrier is removed from the resin, the resin layer is formed by heat-treatment at a temperature at which the resin is hardened, and a face on which the resin layer is formed is processed until the bump appears.

Preferably, the resin is sprayed on the back face on which the external connecting electrodes are provided so that the resin layer is formed thereon, and the back face on which the resin layer is formed is processed until the bump appears.

It is preferred that grinding is performed until the bump appears.

Preferably, a surface of a conductive foil is exposed and coated with the resin paste by screen printing so as to form the resin layer, heat-treatment is performed at a temperature at which the resin layer is hardened, the conductive foil is coated with the solder paste, and heat-treatment is performed at a temperature at which the solder paste is melted to form a solder bump, so that the external connecting electrode is formed.

Preferably, the resin layer made of a sheet is bonded to the back face of the chip carrier so that the resin layer is formed on the chip carrier.

It is preferred that the resin paste has a viscosity of 500 to 200000 cps.

The chip carrier according to the present invention comprises an electrical insulating board, a connecting wiring for connection to the electrode of a semiconductor device which is provided on a first face of the electrical insulating board, and an external connecting electrode for connection to a connecting electrode of a circuit wiring board, provided on the back face of the electrical insulating board, wherein the external connecting electrode is formed by a bump made of a conductor, and a resin layer is formed so as to cover the side of the bump. Accordingly, the periphery of the interface between the body and the bump of the external connecting electrode on which the greatest stress is apt to be applied is covered with the resin so that it can be reinforced. Further, the distortion stress which concentrates on the interface between the bump and the body in the thermal shock test is caused to spread over the resin layer so that the distortion stress generated in the solder portion of each electrode can be relaxed. As a result, the external connecting electrode portion can be prevented from cracking due to a difference between the coefficients of thermal expansion of the chip carrier and the circuit wiring board and the external connecting electrode can be prevented from peeling off. Consequently, the reliability in the thermal shock test can be enhanced.

According to the preferred example in which the resin layer is formed like a convexity around the bump and the tip portion of the bump is exposed, the above functions and effects can be obtained and the resin layer can be formed easily. Thus, the external connecting electrode portion can be reinforced more.

According to the preferred example in which the resin layer is formed like a layer on the back face of the electrical insulating board and the tip portion of the bump is exposed, the external connecting electrode portion can be prevented from cracking often. Further, the resin layer can be formed more easily and productivity can be enhanced. Thus, the external connecting electrode portion can be reinforced more.

According to the preferred example in which the bump comprises a solder ball, the above functions and effects can be obtained and solder coating is not required when bonding the circuit wiring board to the connecting electrode so that the number of steps can be reduced.

According to the preferred example in which the bump is made of a conductor whose main component contains at least one of Sn, Cu, Ag, Au and Ni, the above functions and effects can be obtained and the connecting stability of the circuit wiring board to the connecting electrode can be enhanced so that good electrical connection can be obtained.

According to the preferred example in which the bump is covered with the resin layer to a level of 20% or more with respect to the height thereof from the chip carrier, the above functions and effects can be obtained. In particular, the external connecting electrode portion can be reinforced well by the resin layer.

The present invention provides a method of manufacturing a chip carrier comprising the steps of providing a connecting wiring for connection to the electrode of a semiconductor device on a first face of an electrical insulating board, forming an external connecting electrode having a bump for connection to the connecting electrode of a circuit wiring board on a back face of the electrical insulating board, covering the side portion of the external connecting electrode with a resin paste, and heat-treating at a temperature at which the resin paste is hardened so that a resin layer is formed. Thus, the resin layer can be formed easily. Further, the external connecting electrode portion can be reinforced well by the resin layer. As a result, the chip carrier having high reliability can be manufactured readily.

According to the preferred example in which the resin paste is poured between the external connecting electrodes, and heat-treatment is performed at a temperature at which the resin paste is hardened so that a resin layer is formed, the resin layer can be formed easily and the resin can be hardened readily. Consequently, the external connecting electrode portion can surely be reinforced by the resin layer.

According to the preferred example in which heat is supplied and the resin is poured into the back face on which the external connecting electrodes are provided so as to form the resin layer, the resin is poured so that the resin layer can be formed more quickly and easily. Thus, the external connecting electrode portion can surely be reinforced by the resin layer.

According to the preferred example in which the back face on which the external connecting electrode made of the bump is formed is immersed in the resin paste, the chip carrier is removed from the resin paste, the resin layer is formed by heat-treatment at a temperature at which the resin is hardened, and a face on which the resin layer is formed is processed until the bump appears, the resin layer can be formed more quickly and easily. Thus, the chip carrier in which the external connecting electrode portion is reinforced by the resin layer can be manufactured. Further, the external connecting electrode can surely be exposed so that conduction can be ensured.

According to the preferred example in which the resin is sprayed on the back face on which the external connecting electrodes are provided, the resin layer is formed so as to cover the back face on which the external connecting electrodes are provided, and the face on which the resin layer is formed is processed until the bump appears, the chip carrier in which the external connecting electrode portion is reinforced by the resin layer can be manufactured. Further, the resin layer can be formed more quickly and easily.

According to the preferred example in which grinding is performed until the bump appears, the chip carrier in which the external connecting electrode portion is reinforced more by the resin layer can be manufactured. Further, the resin layer can be formed more quickly and easily.

According to the preferred example in which a surface of a conductive foil is exposed and coated with the resin paste by screen printing, heat-treatment is performed at a temperature at which the resin layer is hardened, the conductive foil is coated with the solder paste, and heat-treatment is performed at a temperature at which the solder paste is melted to form a solder bump so that the external connecting electrode is formed, the chip carrier in which the external connecting electrode portion is reinforced more by the resin layer can be manufactured. Further, the external connecting electrode and the resin layer can be formed more quickly and easily.

According to the present invention, the distortion stress which concentrates on a solder connecting portion in the thermal shock test is caused to spread over the resin layer so that the distortion stress applied on each portion can be relaxed. Further, the interface between the chip carrier and the solder, on which the greatest stress is apt to be applied, can be reinforced by the resin.

BRIEF DESCRIPTION OF THE DRAWINGS

FIGS. 5A to 5D are sectional views for explaining a part of the steps for a method of manufacturing a chip carrier according to an embodiment of the present invention;

FIGS. 6A and 6B are plan views showing a part of a chip carrier on which a resin layer is formed according to another embodiment of the present invention, and FIGS. 6C and 6D are sectional views showing a part of a chip carrier on which a resin layer is formed according to another embodiment of the present invention;

DETAILED DESCRIPTION OF THE INVENTION

A chip carrier according to an embodiment of the present invention will be described with reference to the drawings.

Figure 1:
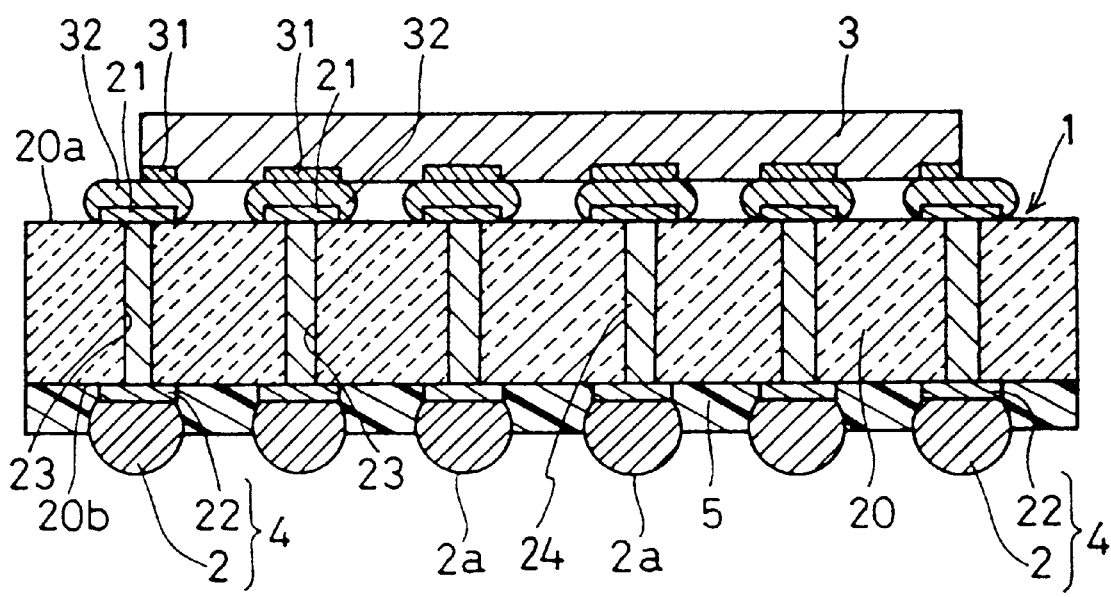
FIG. 1 is a sectional view showing a part of a chip carrier according to an embodiment of the present invention.
Figure 2:
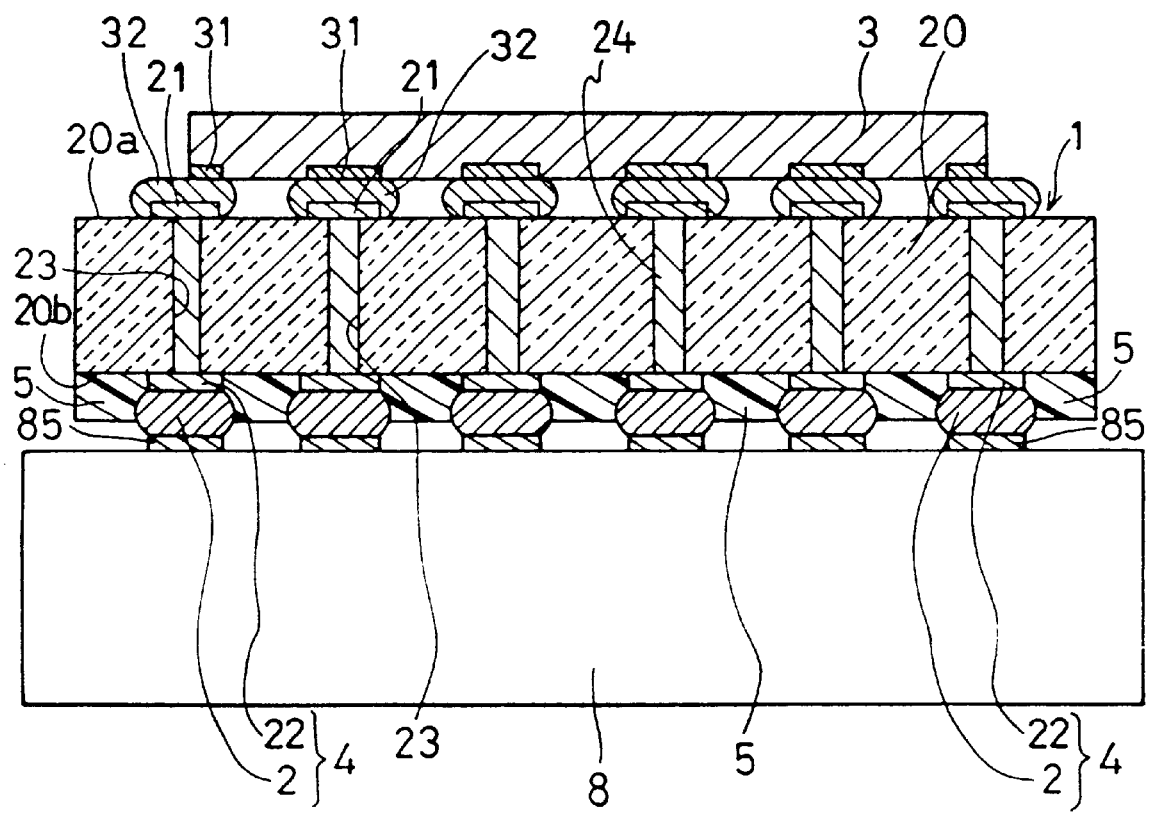
FIG. 2 is a sectional view showing a part of the state in which a chip carrier having solder balls on which a resin layer is formed is mounted on a printed circuit board according to the embodiment of the present invention.
Figure 3:
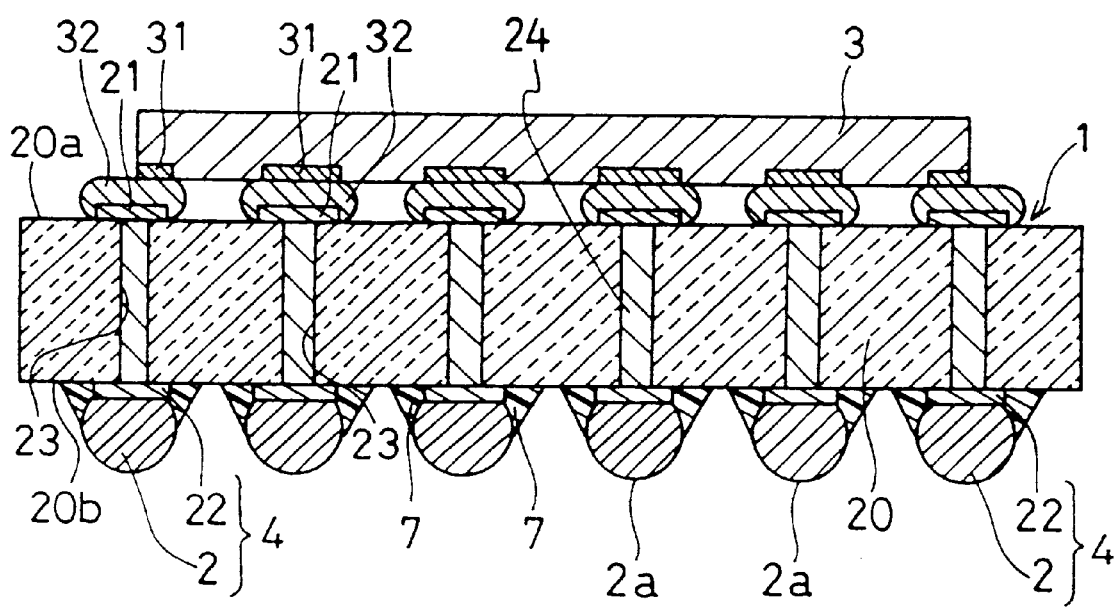
FIG. 3 is a sectional view showing a part of a chip carrier having solder balls on which a resin layer is formed according to another embodiment of the present invention.

FIG. 1 is a sectional view showing a part of a chip carrier according to an embodiment of the present invention. FIG. 2 is a sectional view showing a part of the state in which the chip carrier shown in FIG. 1 is mounted on a printed wiring board. FIG. 3 is a sectional view showing a part of a chip carrier having solder balls whose sides are provided with a resin layer according to another embodiment of the present invention.

In FIGS. 1 and 2, 1 designates a chip carrier for mounting a semiconductor device 3, 2 designates a solder ball connected to an external electrode 22 to form a bump made of a conductor, 4 designates an external connecting electrode (the bump made of a conductor) comprised of the external electrode 22 and the solder ball 2, 5 designates a resin layer for covering the bump, and 8 designates a printed wiring board for mounting the chip carrier 1 on which the semiconductor 3 is mounted.

The chip carrier 1 has the same structure as that of the chip carrier according to the prior art. A connecting electrode 21 is provided on a surface 20a of an electrical insulating board 20, which can be made of glass-ceramics. The connecting electrode 21 has a main component which contains at least one of Sn, Cu, Ag, Au and Ni, and is conducted to an electrode pad 31 of the semiconductor device 9 and a Folder ball 32. An external electrode 22 having the same component is provided on a back face 20b. The external connecting electrode 4 is comprised of the external electrode 22 and the solder ball 2. The connecting electrode 21 on the surface 20a is electrically conducted to the external electrode 22 on the back face 20b through a wiring 24 provided in a through hole 22. The electrodes on both sides of the chip carrier 1 may be conducted through a wiring on a board face.

The solder balls 2 which act as external connecting electrodes on BGA are formed by a solder, and bonded to the external electrodes 22 which are arranged like a grid on the back face 20b of the electrical insulating board 20. The solder ball 2 has a diameter of about 0.5 to 1.0 mm. If the diameter is too small, connecting failures often occur and the connecting reliability becomes poor. If the diameter is too great, a short-circuit may be caused.

The resin layer 5 is provided in order to absorb thermal stress to prevent the electrodes from cracking when bonding the external connecting electrode 4 of the chip carrier 1 to the wiring of the printed wiring board by a solder. The resin layer 5 is formed over the whole surface between the external connecting electrodes 4 on the back face 20b of the electrical insulating board 20, covers from the interface between the external electrode 22 and the solder ball 2 to the vicinity of a tip portion 2a, and has a thickness of about 0.1 to 1.0 mm in such a manner that the tip portion 2a of the solder ball 2 is exposed. More specifically, it is preferred that the thickness of the resin layer 5 is at least 20% with respect to the height of the external connecting electrode 4 and is equal to or more than the radius of the solder ball 2 and is equal to or less than the diameter of the solder ball 2 in such a manner that the interface between the chip carrier 1 and the bump can surely be covered.

An example of a resin used for the resin layer 5 is either of a thermoplastic resin and a thermosetting resin. It is preferred that the resin is used as a resin paste so as to have a viscosity which is not more than about 200000 centipoise at a room temperature at which the resin layer 5 can be formed. In particular, an epoxy resin is preferable. By the above method, the chip carrier having the solder balls on which the resin layer is formed is manufactured.

As shown in FIG. 2, the chip carrier 1 having the above structure is bonded to a connecting wiring 85 of a printed wiring board 8 through the solder balls 2, and thus mounted on the printed wiring board 8. When mounting, heat is applied to bond the external connecting electrode 4 of the chip carrier 1 to the wiring 85 of the printed wiring board 8 by a solder. Even if the thermal stress is generated on the external connecting electrode 4 by heat, the thermal stress can be relieved by the resin layer 5 so that it is possible to prevent the interface of the solder ball 2 of the external connecting electrode 4 from cracking and to prevent connecting failures from occurring.

FIG. 3 is a sectional view showing a part of a chip carrier according to another embodiment of the present invention. The chip carrier according to the present embodiment differs from the embodiment shown in FIG. 1 in that a convex resin layer 7 is provided around the side of each solder ball 2. The same reference numbers designate the same components as in the embodiment shown in FIG. 1, whose detailed description will be omitted.

The resin layer 7 is shaped like a convexity and has a thickness of 0.1 to 0.5 mm around the side of the solder ball 2, and is different from the embodiment shown in FIG. 1 in which the resin layer 7 is provided at almost the same thickness over the whole back face 20b of the electrical insulating board 20. Thus, the resin layer 7 is formed so that a tip 2a of the solder ball 2 can be exposed easily. Consequently, a good connection to the printed wiring board can be obtained readily.

More specific embodiments according to the present invention will be described below.

EXAMPLE 1

A chip carrier according to the present example has a structure shown in FIG. 1. As described above, general glass-ceramics are used for a board 20 of a chip carrier 1, and Cu is used as a board wiring conductor.

The chip carrier according to the present example is manufactured in the following manner. A wiring pattern 21 for mounting a semiconductor device is provided on a surface 20a of the board 20 by using Cu. External electrodes 22 are provided like a grid on a back face 20b of the board 20. The external electrode 22 on the back face 20b of the board 20 is coated with an eutectic solder paste (63Pb/37Sn alloy composition paste manufactured by Senju Kinzoku Co., Ltd.) by metal printing. The solder balls 2 are arranged on the solder paste of the coated external electrode 22 so that an external connecting terminal 4 is formed as an external connecting electrode. The solder ball 2 is formed of a 63Pb/37Sn alloy composition solder and has a diameter of 0.7 mm. The solder paste and the solder ball 2 are melted at a peak temperature of 240° C. for 10 sec. by infrared reflow. By the method described above, the solder ball 2 is formed on the external electrode 22 provided on the back face 20b of the chip carrier 1.

Then, the resin paste held in a syringe is ejected between the solder balls 2 on the back face of the chip carrier 1. The resin paste is used to provide a layer about 0.4 mm thick in such a manner that almost half of the diameter of the solder ball 2 is embedded by the resin paste and a tip 2a of the solder ball 2 is exposed. The resin paste is hardened for 2 hrs. at a temperature of 150° C. in the decompressing atmosphere. An epoxy resin (Ablebond manufactured by ABLESTIK Co., Ltd. 975-2L 20000 cps) is used for the resin paste. The chip carrier having the solder balls on which the resin layer is provided is manufactured by the above method.

A general printed wiring board having a wiring pattern for a mounting reliability test is coated with the eutectic solder paste (63Pb/37Sn alloy composition paste manufactured by Senju Kinzoku Co., Ltd.) by metal printing. The chip carrier having the resin layer is mounted on the printed solder. The solder is melted for 10 sec. at a peak temperature of 240° C. by infrared reflow to manufacture a chip carrier mounting body (see FIG. 2).

The chip carrier mounting body manufactured by the above method is subjected to a thermal shock test (−40° C. to 100° C.) as an environmental reliability test. As a result, it is apparent that a value of resistance is seldom changed over 1000 cycles. Consequently, it is observed that the external connecting electrode does not crack. Accordingly, the chip carrier of a BGA type, which in the past has shown poor mounting reliability in the thermal shock test, can have higher mounting reliability.

EXAMPLE 2

A chip carrier according to the present example has a structure shown in FIG. 3. The chip carrier of the present example differs from that of Example 1 in that a resin layer 7 is provided along the sides of solder balls.

The chip carrier according to the present example is manufactured in the following manner. First of all, a solder ball 2 is provided on an external electrode 22 of a glass-ceramic board 20 to form an external connecting terminal 4 comprised of the external electrode 22 and the solder ball 2 similarly to Example 1.

Then, the resin paste held in a syringe is ejected onto the solder balls 2 of a back face 20b of a chip carrier 1. The resin paste is applied so as to have a thickness of about 0.2 mm in such a manner that the connecting face of the board 20 to the solder ball 2 is completely embedded and a tip 2a of the solder ball 2 is exposed. After the resin paste is ejected, the tip portion of the solder ball 2 is washed with ethanol. The resin paste is hardened for 2 hrs. at a temperature of 150° C. in the decompressing atmosphere. The same epoxy resin as in Example 1 is used for the resin paste.

A general printed wiring board having a wiring pattern for a mounting reliability test is coated with an eutectic solder paste (63Pb/37Sn alloy composition paste manufactured by Senju Kinzoku Co., Ltd.) by metal printing. The chip carrier 1 on which the resin layer 7 is formed is mounted on the printed solder. The solder is melted for 10 sec. at a peak temperature of 240° C. by infrared reflow.

A chip carrier mounting body manufactured by the above method is subjected to a thermal shock test (−40° C. to 100° C.) as an environmental reliability test. As a result, it is apparent that a value of resistance is seldom changed over 1000 cycles. Consequently, it is observed that the external connecting electrode does not crack. Accordingly, the chip carrier of a BGA type, which in the past has shown poor mounting reliability in the thermal shock test, can have higher mounting reliability.

EXAMPLE 3

Figure 4:
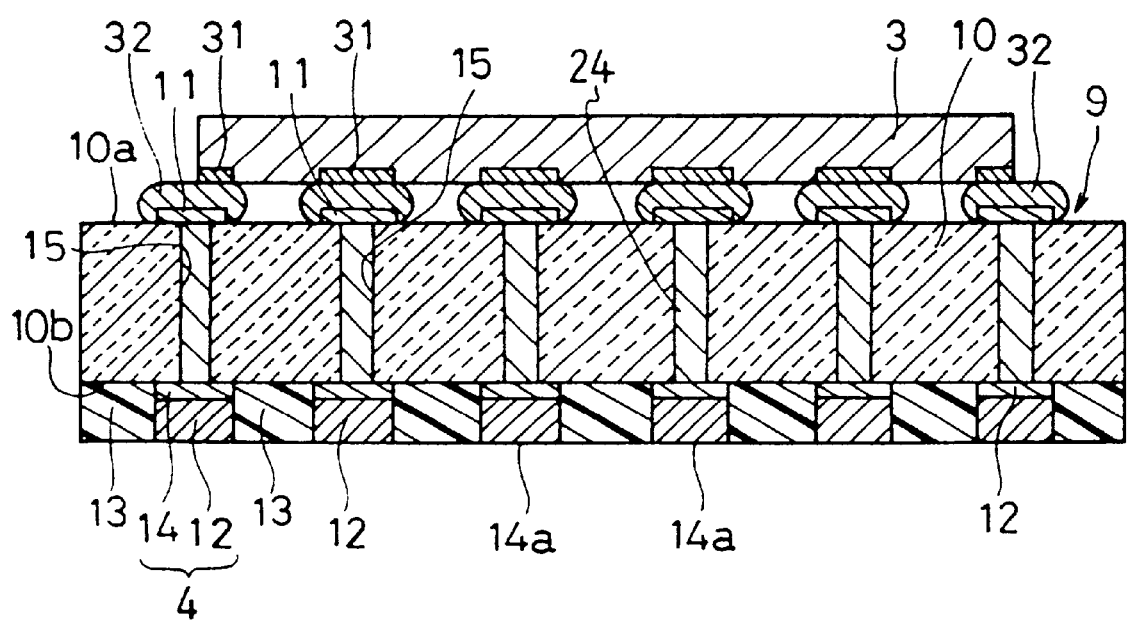
FIG. 4 is a sectional view showing a part of a chip carrier having solder balls on which a resin layer is formed according to yet another embodiment of the present invention.

A chip carrier according to the present example has a structure shown in FIG. 4. In FIG. 4, 9 designates a chip carrier on which a semiconductor device 3 is mounted, 11 designates a wiring pattern for conduction to a connecting electrode 31 of the semiconductor device 3, 13 designates a resin layer which covers a bump 14 made of a conductor, and 15 designates a through hole through which a conductor for conducting both sides of the board is provided. The chip carrier 9 of the present example differs from the chip carrier 1 of Example 1 in that the external connecting terminal (electrode) 4 is formed by the bump 14 made of a conductor and an external electrode 12.

A wiring pattern 11 is provided on a surface 10a of a glass-ceramic board 10 similarly to Example 1. The chip carrier 9 is bonded by the connecting electrode 31 of the semiconductor device 3 and a solder 32 through the wiring pattern 11 and is electrically conducted. The external electrode 12 is provided on a back face 10b of the board 10. A bump 14 made of a conductor is formed on the surface of the external electrode 12. An external connecting terminal 4 is comprised of the external electrode 12 and the bump 14. The wiring pattern 11 on the surface 10a of the board 10 is conducted to the external electrode 12 on the back face 10b of the board 10 through the through hole 15. Cu is used to form the wiring pattern 11 and the external electrode 12. The resin layer 13 is provided at a thickness of about 0.3 mm over the whole back face 10b including the periphery of the bump 14 made of a conductor. A resin is removed from a tip 14a of the bump 14 to keep conductivity.

The chip carrier 9 according to the present example is manufactured in the following manner. First of all, the wiring pattern 11 for mounting a semiconductor device is provided on the surface 10a of the board 10 by using Cu. The external electrodes 12 are provided like a grid on the back face 10b of the board 10. The bump 14 is formed on the external electrode 12 provided on the back face 10b of the board 10 by Cu plating. The bump 14 has a height of 200 $\mu$m.

Then, a resin paste is supplied into a flat stainless steel tray so as to have a uniform thickness so that a resin paste vessel is formed. The chip carrier 9 on which the bump 14 is formed is dropped onto the resin paste, oriented with the bump 14 (back face 10b) as a bottom face, and is immersed to reach the interface between the bump 14 and the board 10. Then, the chip carrier 9 is pulled up and removed from the resin paste vessel. The chip carrier 9 coated with the resin paste is placed on a hot plate with the surface 10a of a chip mounting face placed on the bottom, and heated to soften the resin paste. Thus, a resin paste layer is uniformly formed on the chip carrier 9. The hot plate has a temperature of 60° C. Then, the resin paste is hardened for 2 hrs. at a temperature of 150° C. in the decompressing atmosphere so that a resin layer 11 is formed. The same resin paste as in Example 1 is used.

The resin layer according to the present example may be formed in the same manner as in Examples 1 and 2.

The resin layer 13 side of the chip carrier 9 having the hardened resin layer 13 is polished by a file until the surface 14a of the bump 14 made of a conductor is exposed. In this case, when the resin layer 13 formed on the bump 14 made of a conductor is broken, the conductor portion can be exposed to the surface.

A general printed wiring board having a wiring pattern for a mounting reliability test is coated with an eutectic solder paste (63Pb/37Sn alloy composition paste manufactured by Senju Kinzoku Co., Ltd.) by metal printing. The polished chip carrier is mounted on the printed solder. The solder is melted for 10 sec. at a peak temperature of 240° C. by infrared reflow.

A chip carrier mounting body manufactured by the above method is subjected to a thermal shock test (−40° C. to 100° C.) as an environmental reliability test. As a result, it is apparent that a value of resistance is seldom changed over 1000 cycles. Consequently, it is observed that the external connecting electrode does not crack. Accordingly, the chip carrier of a BGA type, which in the past has shown poor mounting reliability in the thermal shock test, can have higher mounting reliability.

EXAMPLE 4

FIGS. 5A to 5D show a part of the steps for manufacturing a chip carrier according to the present example. In FIGS. 5A to 5D, 40 designates an electrical insulating wiring board on which a chip carrier is formed. A wiring electrode 41 is formed on the surface of the board 40, and an external electrode 42 and a resin 43 are formed on the back face of the board 40. 44 designates an etched hole, and 45 designates a solder bump which is formed in the etched hole 44.

General glass-ceramics are used for a chip carrier board and Cu is used for a board wiring conductor similarly to the foregoing.

As shown in FIG. 5A, the pattern of the wiring electrode 41 for mounting a semiconductor device is formed on the surface of the board 40 by using Cu, and the external electrodes 42 are formed like a grid on the back face of the board 40.

As shown in FIG. 5B, the resin paste is solid-printed over the whole back face of the board 40 by means of a metallic plate so that the resin layer 43 is formed at a thickness of 200 $\mu$m. Then, the resin paste is hardened for 2 hrs. at a temperature of 150° C. in the decompressing atmosphere. The same resin paste as in Example 1 is used.

As shown in FIG. 5C, the external electrode 42 which is provided on the back face of the board 40 having the resin layer 43 is etched to form a hole 44 on the resin layer 43 of the external electrode 42 so that the electrode 42 is exposed.

As shown in FIG. 5D, the hole 44 on the external electrode 42 is coated with an eutectic solder paste (63Pb/37Sn alloy composition paste manufactured by Senju Kinzoku Co., Ltd.) by metal printing. The solder is melted for 10 sec. at a peak temperature of 240° C. by infrared reflow so that a conductive layer 45 is provided.

A general printed wiring board having a wiring pattern for a mounting reliability test is coated with the eutectic solder paste (63Pb/37Sn alloy composition paste manufactured by Senju Kinzoku Co., Ltd.) by metal printing. The chip carrier having the resin layer is mounted on the printed solder. The solder is melted for 10 sec. at a peak temperature of 240° C. by infrared reflow.

A chip carrier mounting body manufactured by the above method is subjected to a thermal shock test (−40° C. to 100° C.) as an environmental reliability test. As a result, it is apparent that a value of resistance is seldom changed over 1000 cycles. Consequently, it is observed that the external connecting electrode does not crack. Accordingly, the chip carrier of a BGA type, which in the past has shown poor mounting reliability in the thermal shock test, can have higher mounting reliability.

EXAMPLE 5

A chip carrier according to the present example has a structure shown in FIGS. 6A to 6D. FIG. 6A is a plan view seen from a chip carrier on which a printed wiring board is mounted. In FIG. 6A, 20 designates a face of a glass-ceramic wiring board on which a printed wiring board is mounted, and 22 designates an external electrode. FIG. 6B is a plan view showing a sheet made of a resin. In FIG. 6B, 50 designates the sheet made of a resin, and 51 designates a punch hole. FIG. 6C is a sectional view showing the state in which the parts of FIGS. 6A and 6B have been bonded. The chip carrier of the present example differs from that of Example 1 in that solder balls are not mounted and a resin layer is formed of a sheet.

The chip carrier according to the present example is manufactured in the following manner. First of all, the external electrode 22 of the board 20 is formed in the same manner as in Example 1.

Then, a hole having a diameter of 0.5 mm is formed on a sheet made of a thermoplastic polyoxyether resin which has a thickness of 0.15 mm by means of a punching machine. The softening point of the resin sheet is 160° C. The external electrode of the chip carrier and the hole portion of the sheet are aligned so as to correspond to each other. The sheet may be temporarily bonded to the chip carrier in the following manner. More specifically, a flat stainless steel tray treated with a polytetrafluoroethylene resin (Teflon) is heated to about 160° C. The aligned chip carrier is temporarily bonded to the sheet by means of the heated stainless steel tray. Thus, the sheet can be temporarily bonded to the chip carrier. In addition, the following method can be performed. More specifically, the aligned chip carrier is heated to about 160° C. on the hot plate, and pressurized for a desired time by the flat stainless steel tray treated with a polytetrafluoroethylene resin (Teflon). Thus, the sheet made of a resin can be bonded to the chip carrier. While the polyoxyether resin has been used for the sheet in the present example, a resin having a softening point in the range of 160° C. up to a solder paste melting temperature or less also has the same effects. The resin layer should have a softening point of 160° C. or more so as not to be softened by a shelf test at a temperature of 150° C.

A general printed wiring board having a wiring pattern for a mounting reliability test is coated with an eutectic solder paste (63Pb/37Sn alloy composition paste manufactured by Senju Kinzoku Co., Ltd.) at a thickness of 0.15 mm by metal printing. The chip carrier having the resin layer is mounted on the printed solder in such a manner that the external electrodes of the chip carrier correspond to the solder paste on the electrodes of the printed wiring board. The solder is melted for 10 sec. at a peak temperature of 240° C. by infrared reflow. When melting the solder, the resin layer formed on the chip carrier is softened so that the chip carrier is bonded to the printed wiring board. FIG. 6D is a sectional view showing the state in which the chip carrier has been mounted on the printed wiring board. In FIG. 6D, 52 designates a printed wiring board, 53 designates a connecting electrode, and 54 designates a solder.

A chip carrier mounting body manufactured by the above method is subjected to a thermal shock test (−40° C. to 100° C.) as an environmental reliability test. As a result, it is apparent that a value of resistance is seldom changed over 1000 cycles. Consequently, It is observed that the external connecting electrode does not crack. Accordingly, the chip carrier of a LGA type, which in the past has shown poor mounting reliability in the thermal shock test, can have higher mounting reliability.

The same effects can be obtained by the chip carrier having a solder which is melted as follows. More specifically, the sheet made of a resin is bonded to the chip carrier. By the screen printing method, the solder paste is then printed on the punch hole formed on the resin sheet. The solder is melted for 10 sec. at a peak temperature of 240° C. by infrared reflow.

EXAMPLE 6

Figure 7:
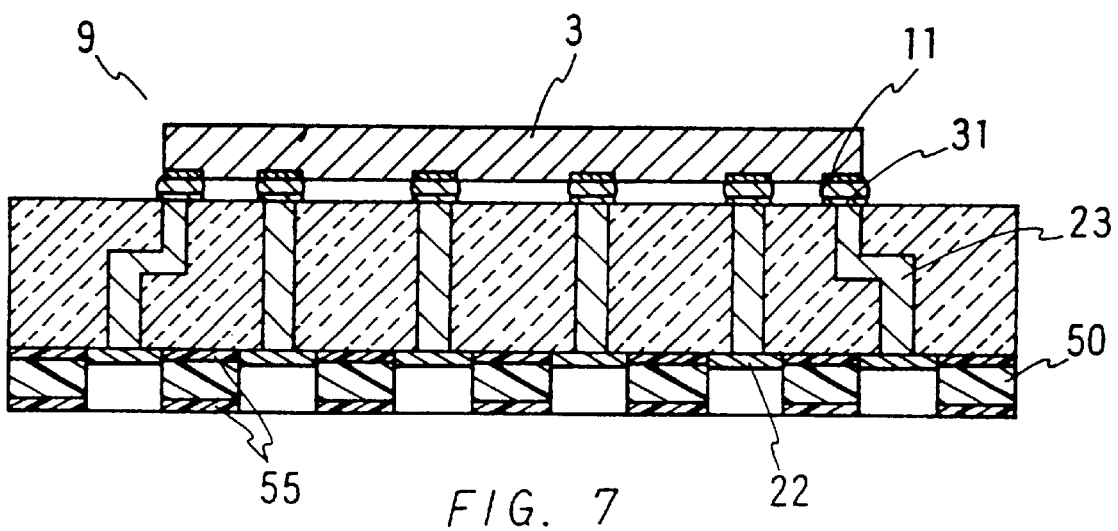
FIG. 7 is a sectional view showing a part of a chip carrier on which a resin layer is formed according to yet another embodiment of the present invention.
Figure 8:
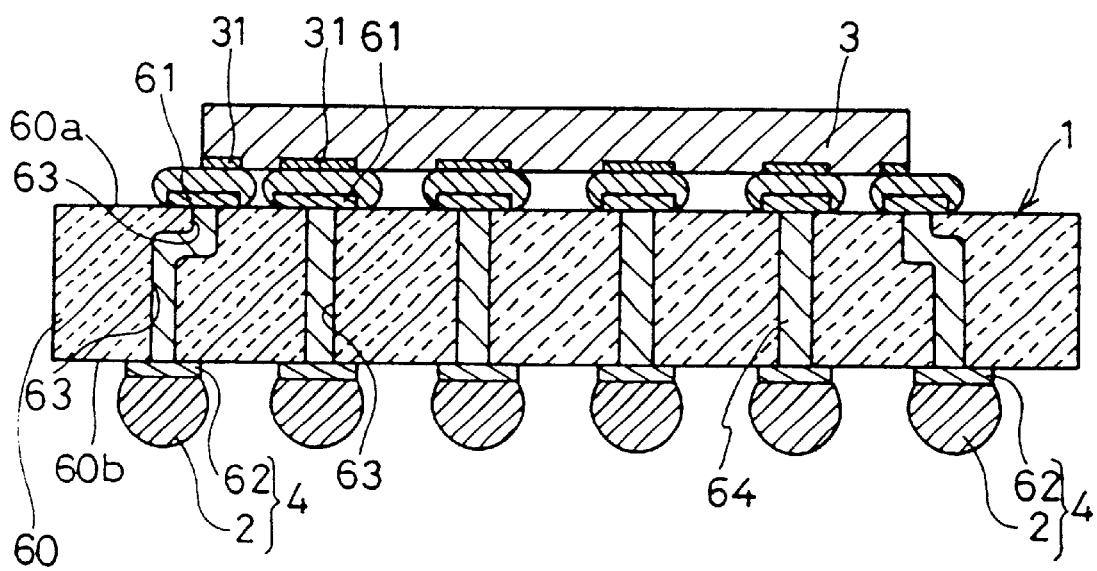
FIG. 8 is a sectional view showing a part of a BGA (ball grid array) package according to the prior art.

A chip carrier according to the present example has a structure shown in FIG. 7. In FIG. 7, 9 designates a chip carrier on which a semiconductor device 3 is mounted, 11 designates a wiring pattern for connection to a connecting electrode 31 of the semicoductor device 3, 23 designates a through hole in which a conductor for connecting both sides of a board is provided, 22 designates an external electrode, 50 designates a resin layer, and 55 designates a bonding layer. The chip carrier according to the present example differs from that of Example 5 in that a bonding layer is provided on both sides of a sheet made of a resin.

Then, a hole having a diameter of 0.5 mm is formed by means of a punching machine on the sheet (whose thickness is 0.15 mm) made of an epoxy resin that has the bonding layer (whose thickness is 0.05 mm) on both sides. The external electrodes of the chip carrier and the hole portions of the sheet are aligned and bonded so as to correspond to each other.

A general printed wiring board having a wiring pattern for a mounting reliability test is coated with an eutectic solder paste (63Pb/37Sn alloy composition paste manufactured by Senju Kinzoku Co., Ltd.) at a thickness of 0.15 mm by metal printing. The chip carrier having the resin layer is mounted and bonded onto the printed solder in such a manner that the external electrodes of the chip carrier correspond to the solder paste on the electrodes of the printed wiring board. The solder is melted for 10 sec. at a peak temperature of 240° C. by infrared reflow.

A chip carrier mounting body manufctured by the above method is subjected to a thermal shock test (−40° C. to 100° C.) as an environmental reliability test. As a result, it is apparent that a value of resistance is seldom changed over 1000 cycles. Consequently, it is observed that the external connecting electrode does not crack. Accordingly, the chip carrier of a LGA type, which in the past has shown poor mounting reliability in the thermal shock test, can have higher mounting reliability.

The same effects can be obtained by the chip carrier having a solder which is melted as follows. More specifically, the sheet made of a resin is bonded to the chip carrier. By the screen printing method, the solder paste is then printed on the punch hole formed on the resin sheet. The solder is melted for 10 sec. at a peak temperature of 240° C. by infrared reflow.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A method of manufacturing a chip carrier comprising the steps of:

forming through holes in a resin sheet;

providing connecting wiring for connection to an electrode of a semiconductor device on a first face of an electrical insulating board;

forming an external connecting electrode for connection to a connecting electrode of a circuit wiring board; and bonding, to the back face of the electrical insulating board, the resin sheet with through holes already formed, the through holes being in corresponding positions to the external connecting electrodes, the sheet being bonded to the electrical insulating board in such a manner that the external connecting electrodes correspond to the through holes, so that a resin layer is formed, the external connecting electrodes being below the surface of the resin layer and exposed, and a surface of the external connecting electrode being without a bump.

2. The method according to claim 1, wherein an adhesive resin layer is provided on the surface of the sheet made of a resin.

3. The method according to claim 1, wherein the surface of the sheet made of a resin is provided on the back face of the electrical insulating board, and the resin sheet is melted at a suitable temperature and bonded to the electrical insulating board so that the resin layer is formed.

4. A method of mounting a chip carrier on a circuit wiring board, the chip carrier having a back face on which a resin sheet already provided with through holes therein has been applied in such a manner that an external connecting electrode portion is exposed through the through holes, the external connecting electrode being below the surface of the resin layer, connecting wiring being provided on a first face of the chip carrier for connection to an electrode of a semiconductor device, the semiconductor device and the external connecting electrode being connected electrically, the method comprising the steps of:

forming a solder paste layer on a connecting electrode of the circuit wiring board;

mounting the chip carrier on the circuit wiring board in such a manner that the external connecting electrode of the chip carrier is connected to a solder paste on the connecting electrode of the circuit wiring board;

melting the solder paste at a suitable temperature; and bonding the resin layer formed on the back face of the chip carrier to the circuit wiring board.

5. The method according to claim 4, wherein the resin layer is bonded to the circuit wiring board by a bonding layer provided on the surface of the resin layer.

6. The method according to claim 5, wherein the resin layer is melted when melting the solder paste, so that the chip carrier is bonded to the circuit wiring board.

7. The method according to claim 4, wherein the thickness of the resin layer is substantially equal to or less than that of the solder paste layer formed on the circuit wiring board.

8. The method according to claim 4, wherein the softening point of the resin layer is not less than 150° C. and is not more than the solder paste melting temperature.

* * * * *